US006600547B2

(12) United States Patent
Watson et al.

(10) Patent No.: US 6,600,547 B2
(45) Date of Patent: Jul. 29, 2003

(54) SLIDING SEAL

(75) Inventors: Douglas C. Watson, Campbell, CA (US); Alton Hugh Phillips, Mountain View, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/962,963

(22) Filed: Sep. 24, 2001

(65) Prior Publication Data

US 2003/0058426 A1 Mar. 27, 2003

(51) Int. Cl.[7] .............................................. G03B 27/52
(52) U.S. Cl. ....................................................... 355/30
(58) Field of Search ..................... 355/73, 30; 277/390, 277/394, 395, 408, 500, 549, 552

(56) References Cited

U.S. PATENT DOCUMENTS

| 3,510,230 | A | * | 5/1970 | Raub ............................ 277/500 |
| 3,804,424 | A | * | 4/1974 | Gardner ........................ 277/360 |
| 4,523,764 | A | * | 6/1985 | Albers et al. ................. 277/400 |
| 5,528,118 | A | | 6/1996 | Lee ......................... 318/568.17 |
| 5,623,853 | A | | 4/1997 | Novak et al. ............. 74/568.17 |
| 5,668,672 | A | | 9/1997 | Oomura ....................... 359/727 |
| 5,689,377 | A | | 11/1997 | Takahashi .................... 359/727 |
| 5,812,117 | A | | 9/1998 | Moon .......................... 345/169 |
| 5,835,275 | A | | 11/1998 | Takahashi et al. .......... 359/629 |
| 5,874,820 | A | | 2/1999 | Lee ............................. 318/575 |
| 6,333,775 | B1 | * | 12/2001 | Haney et al. ................ 277/608 |

* cited by examiner

Primary Examiner—Russell Adams
Assistant Examiner—D. Ben Esplin
(74) Attorney, Agent, or Firm—Beyer Weaver & Thomas, LLP

(57) ABSTRACT

A sliding seal system for providing a fluid seal that is slidable in two linear and one rotational degrees-of-freedom and that is flexible in one linear and two rotational degrees-of-freedom is disclosed. The sliding seal system includes a support member having a working surface arranged to provide a seal interface with a sealing surface on a first body. A flexible membrane is attached to the support member and coupled to a second body. A fluid supply system is provided to deliver a fluid to a region between the working surface of the support member and the sealing surface of the first body to provide buoyant flotation to the seal support member at the working surface. In a preferred embodiment, a fluid exhaust system is also provided to remove the fluid delivered by the fluid supply system. One particularly useful application of the described sliding seal system is in a photolithography system to provide a seal between an exposure apparatus and a wafer chamber.

28 Claims, 14 Drawing Sheets it is often desirable to provide a seal between the exterior of the optical device (which might be in an air based atmosphere) and the lower enclosure (which may be in the controlled atmosphere). A potential problem with providing a seal between the optical device and the lower enclosure is that many if not most seal designs provide mechanical structures that may act to transmit vibrations between their associated components.

SLIDING SEAL

FIELD OF THE INVENTION

The present invention relates generally to a fluid seal apparatus. More particularly, the present invention relates to a sliding seal arrangement that provides linear and rotational mobility and flexibility in multiple degrees-of-freedom.

BACKGROUND OF THE INVENTION

Mechanical seals, including liquid seals, gas seals, pressure seals, and vacuum seals, are widely used in a variety of applications. Materials such as metals, plastics, foams, and elastomers are commonly used to provide a sealing relationship between surfaces of two or more bodies by filling gaps or bridging voids interposing between these surfaces. Fluid seal configurations include, for example, flexible o-rings or gaskets, which are typically deformed under compression to provide an impermeable barrier between solid surfaces of spaced-apart bodies. Isolation of high-pressure fluids within a confinement structure, maintenance of a vacuum, separation of dissimilar fluids, and prevention of leakage and contamination are but a few applications for fluid seal apparatuses.

In addition, many seals are used to provide a controlled environment to equipment components or process workpieces within an enclosed chamber, isolating them from conditions exterior the enclosure. For example, seals may be used to prevent air and/or other gases from leaking into an enclosure to shield workpieces within the chamber from chemical or physical interaction with these gases. Numerous novel approaches and improvements to fluid seals have been offered.

An application wherein it is advantageous to present an effective fluid seal that provides both mobility and flexibility between the sealed bodies and damping of vibrational force across the seal is the lithography processing steps of semiconductor integrated circuit (IC) manufacture. Conventional lithography processes, for example, photolithography processes, include optical lithography systems and electron beam projection systems Current IC manufacturing practices use lithography photomasks (reticles) to apply various patterns to a photosensitized semiconductor wafer used to create the ICs. Reticles are typically high-precision plates that contain a pattern of extremely small images of the various components of an electronic circuit. A reticle is used as a master to transfer a plurality of the circuit pattern onto a photosensitized wafer. Current state-of-the-art lithographic system often must position an ultra-fine image to within 15 nanometers. Current circuit architectures often have conductor linewidths as narrow as 30 nanometers. Accordingly, lithography processing equipment requires advanced precision optical and mechanical systems and even higher precision systems will be required in the future, as still smaller images become common.

Lithographic exposure apparatuses are used to project images from the reticle onto the photosensitized wafer during semiconductor processing. A typical exposure apparatus includes a base frame having a lower enclosure that contains a wafer stage for holding a semiconductor wafer workpiece. The base frame also supports an optical device that holds a reticle stage and is arranged to project the images from a reticle carried by the reticle stage onto the wafer workpiece. The base frame typically supports the optical device through a vibration isolation system designed to damp and isolate vibrations between components of exposure apparatus so that vibrations in one component are not transmitted to the other. This is deemed necessary because mechanical vibrations transmitted between components can adversely influence the accuracy of exposure apparatus. At the same time, it often is desirable to provide a controlled atmosphere (typically an inert atmosphere such as helium) in the region of the wafer enclosure. In order to reduce the region that must be most carefully controlled, it Therefore, there are continuing efforts to provide improved sealing devices that provide an effective fluid seal between two movable bodies and that further provides damping or isolation of vibrational force between the bodies.

SUMMARY OF THE INVENTION

To achieve the foregoing and other objects of the invention, a sliding seal system is described that provides a fluid seal between a pair of bodies while allowing low friction mobility in three degrees-of-freedom and low stiffness flexibility in three additional degrees-of-freedom between the bodies. Mobility is provided in one rotational and two linear directions ($\Theta_Z$, X, Y) while flexibility is provided in one linear and two rotational directions (Z, $\Theta_X$, $\Theta_Y$).

In one embodiment, the sliding seal system includes a support member having a working surface arranged to provide a seal interface with a sealing surface on the first body. A flexible membrane is attached to the support member and coupled to the second body. A fluid supply system is provided to deliver a fluid to a region between the working surface of the support member and the sealing surface of the first body to provide buoyant flotation to the seal support member at the working surface. In a preferred embodiment, a fluid exhaust system is also provided to remove the fluid delivered by the fluid supply system.

In some embodiments, the fluid supply system includes fluid delivery passages and the fluid exhaust system includes fluid exhaust passages designed to remove fluid delivered through the fluid delivery passages. Such plumbing may be incorporated into the support member or the first body or into a combination of the two. The fluid delivery and exhaust systems may also include fluid distribution channels cut into either the working surface of the support member or the sealing surface of the first body for improving the distribution and/or collection of the fluid about the sealing region.

In some embodiments, the fluid supply system may include interior and exterior fluid delivery passages arranged to deliver different fluids to the sealing region. If a fluid exhaust system is provided, the fluid exhaust system may also include interior and exterior fluid exhaust passages. With this arrangement, the interior fluid exhaust passages are designed to remove fluid delivered through the interior fluid delivery passages and the exterior fluid exhaust passages are designed to remove fluid delivered through the exterior fluid delivery passages.

In some embodiments, the support member includes a top ring and a bottom ring and the flexible membrane is clamped between the top and bottom rings. With this arrangement, the fluidics can be at least partially incorporated into the bottom ring.

One particularly useful application of the described sliding seal system is in a photolithography system to provide a seal between an exposure apparatus and a wafer chamber. In specific embodiments, a lithography system having an illumination source, an optical system, a reticle stage arranged to retain a reticle and a working stage arranged to retain a workpiece (e.g. a wafer) is described. An enclosure having a sealing surface is provided that surrounds at least a portion of the working stage. A support member having a working surface is arranged to provide a seal interface with the sealing surface on the enclosure. A membrane is attached to the support member and coupled to the optical system to provide a seal for the workpiece (wafer) chamber. A fluid supply system delivers a fluid to a region between the working surface of the support member and the sealing surface of the enclosure to provide buoyant floatation to the support member at the working surface. With this arrangement, a sliding seal system is formed that provides a seal between the working surface of the enclosure and the optical system. The sliding seal arrangement may have any of the previously described configurations. Such lithography systems can be used to manufacture objects such as semiconductor wafers.

These and other features, aspects, and advantages of the present invention will become apparent upon reading the following detailed descriptions and studying the various figures of the drawings.

BRIEF DESCRIPTION OF THE DRAWINGS

Some of the drawings provided herein include a Cartesian coordinate system that designates linear directions on an X-axis, a Y-axis, a Z-axis, and angular bearings about the X-axis ($\Theta_X$-Roll), the Y-axis ($\Theta_Y$-Pitch), and the Z-axis ($\Theta_Z$-Yaw. It should be understood that the coordinate system is merely for reference and can be varied. For example, the X-axis can be switched with the Y-axis.

The invention may best be understood by reference to the following description taken in conjunction with the accompanying drawings in which.

DETAILED DESCRIPTION OF THE DRAWINGS

The following is a detailed description of illustrative embodiments of the present invention. As these embodiments of the present invention are described with reference to the aforementioned drawings, various modifications or adaptations of the specific structures described may become apparent to those skilled in the art. All such modifications, adaptations, or variations that rely upon the teachings of the present invention, and through which these teachings have advanced the art, are considered to be within the spirit and scope of the present invention.

State-of-the-art photolithography systems used in the production of ICs must generally be arranged to operate with a minimum of vibrations and distortion of components comprising the optical and stage systems. It is also advantageous in a photolithography system to control the fluid, generally gaseous, environment adjacent reticle and wafer stages of the system by providing an enclosure and a fluid sealing apparatus necessary to maintain the environment surrounding these movable stages.

A first embodiment of the present invention provides a fluid sealing apparatus which allows for low friction mobility in three degrees-of-freedom and low stiffness flexibility in three additional degrees-of-freedom between bodies in a sealing relationship. Mobility is provided in one rotational and two linear directions ($\Theta_Z$, X, Y) while flexibility is provided in one linear and two rotational directions (Z, $\Theta_X$, $\Theta_Y$).

Figure 2:
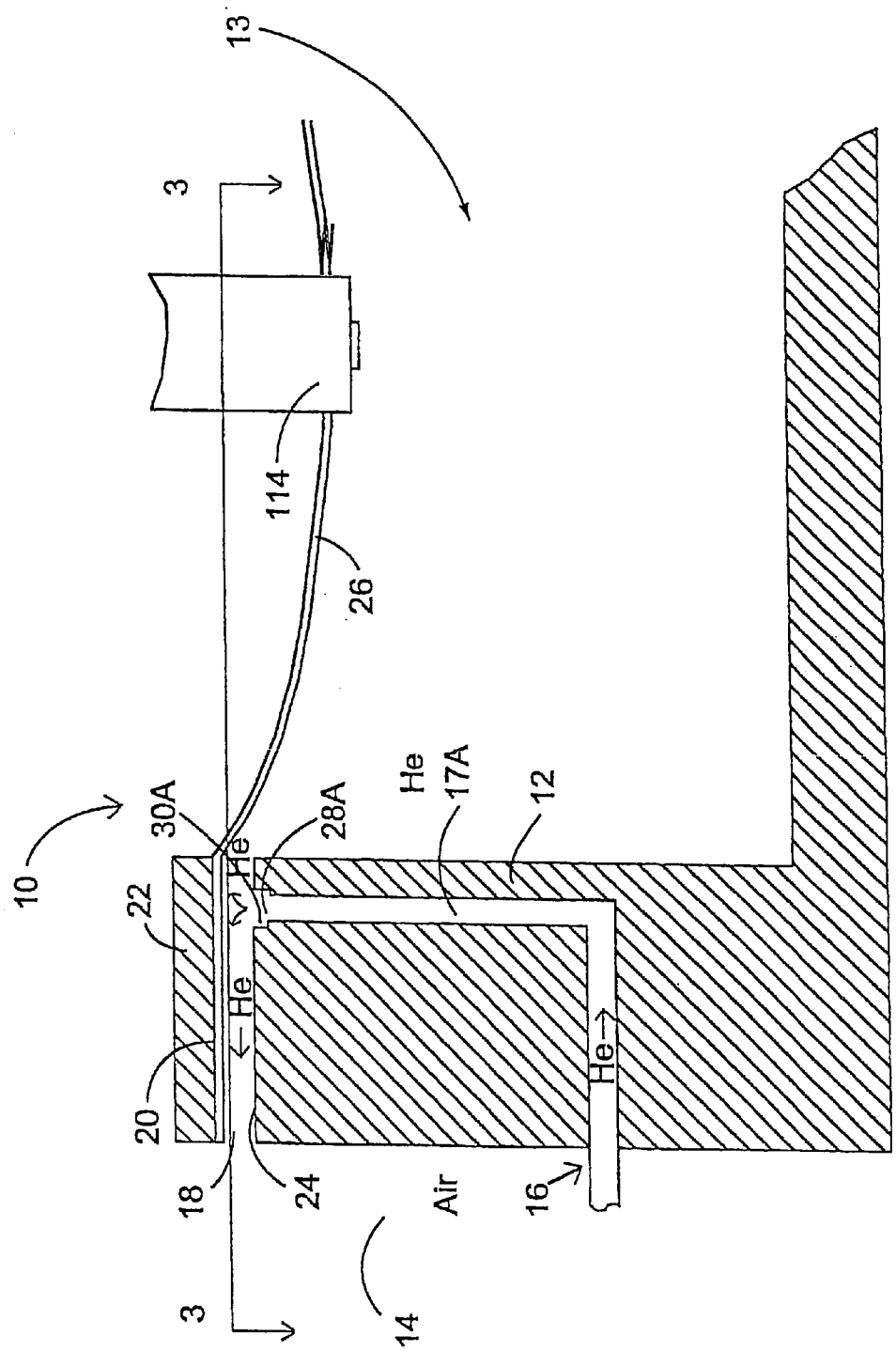
FIG. 2 is a diagrammatic cross-sectional representation of the overall configuration in accordance with a first embodiment of the present invention.

FIG. 2 shows a cross section of the first embodiment of the present invention wherein a sealing relationship is formed between an optical device 114 and a generally rectangular enclosure 12 surrounding a stage (not shown) of a photolithography system. In this embodiment, the interior 13 of enclosure 12 contains helium to provide inert conditions within enclosure 12 for photolithography components such as stages and reticles and for wafer workpieces (not shown). A seal interface region 18 is formed between a working surface 20 on a seal support member 22 and a sealing surface 24 along the top perimeter of enclosure 12. Seal support member 22 is shaped to generally conform to sealing surface 24 of enclosure 12. A fluid system 16 delivers a fluid such as helium to the seal interface region 18 to buoyantly float the seal support member 22 relative to the enclosure 12. In this embodiment, an outflow of fluid from seal interface region 18 effectively prevents the intrusion of exterior air into enclosure 12 through seal interface region 18. A membrane 26, impermeable to helium and air, seals the area between seal support member 22 and optical device 114, thus completing the seal between an exterior 14 and interior 13 of enclosure 12. While helium is flowing to seal interface region 18, the described structure effectively provides a gas seal between the interior 13 and exterior 14 of enclosure 12.

In addition to effectively providing a gas seal between the interior 13 and exterior 14 of enclosure 12, the described structure also allows for low friction mobility in three degrees-of-freedom ($\Theta_Z$, X, Y) between enclosure 12 and optical device 114. Both optical device 114 and enclosure 12 are independently free to rotate in a yawing motion 360° about the vertical Z-axis ($\Theta_Z$) of the photolithography system. (In a typical photolithography system, yawing motion is limited to a small arc due to constraints imposed by other components in the system including components of the described structure.) Likewise, both bodies are, within the limits of the seal and the photolithography system, independently free to move linearly along both the lateral front-to-back X-axis and the lateral left-to-right Y-axis. Helium flowing at the interface region provides buoyant bearing to seal support member 22 at its working surface 20. Seal support member 22 literally "floats" on a cushion of flowing helium. This phenomenon is known to those skilled in the art and is the working principle behind structures such as "air bearings" and "air slides", both of which are utilized for other purposes in photolithography systems. Bearing of seal support member 22 by buoyant flotation rather than by direct contact provides low friction support of the mass of seal support member 22. In the described structure, typical coefficients of static and dynamic friction between seal support member 22 and enclosure 12 are extremely low. Thus in each instance of movement of seal support member's 22 working surface 20 is able to easily slip parallel to sealing surface 24 of enclosure 12. The surfaces defining seal interface region 18 itself are slidable.

Figure 3:
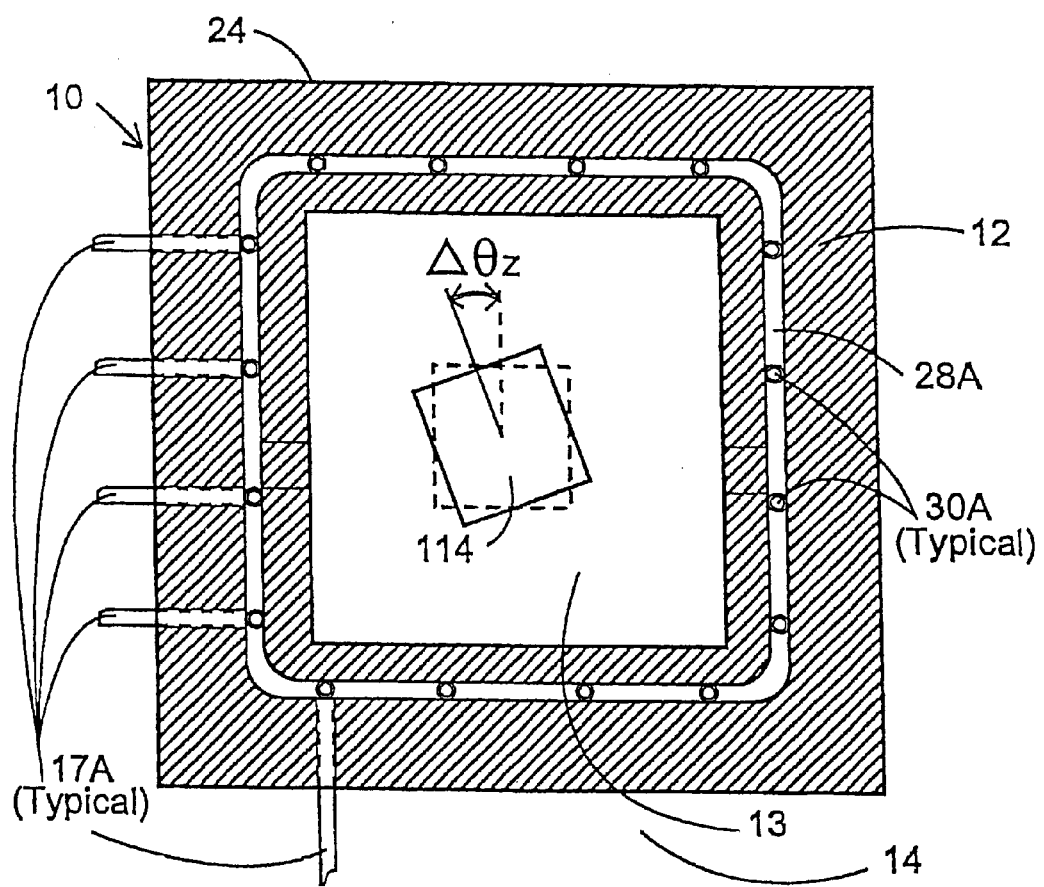
FIG. 3 is a diagrammatic plan-view sectional representation of the overall configuration of FIG. 2 showing rotational displacement in accordance with the first embodiment of the present invention.
Figure 4:
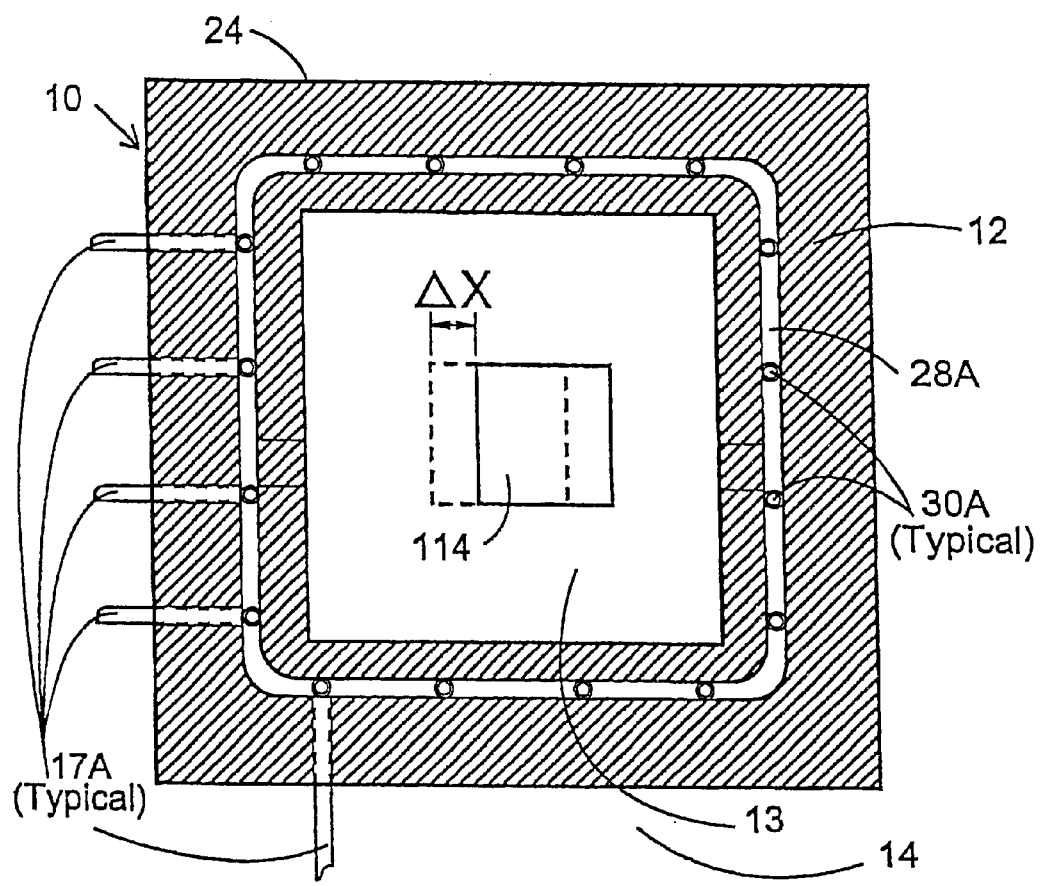
FIG. 4 is a diagrammatic plan-view representation of the overall configuration of FIG. 2 showing linear displacement in accordance with the first embodiment of the present invention.

FIG. 3 is a diagrammatic plan-view representation of the overall configuration of FIG. 2 taken on the line 3—3 in accordance with the first embodiment of the present invention showing rotational displacement of optical device 114 in relation to enclosure 12. Rotation of optical device 114 about the Z-axis produces a change in angular bearing $\Delta\Theta_X$ of optical device 114. FIG. 4 is a diagrammatic plan-view representation of the overall configuration of FIG. 2 taken on the line 3—3 in accordance with the first embodiment of the present invention showing linear displacement of optical device 114 in relation to enclosure 12. Translation of optical device 114 along the Z-axis produces a change in the linear position $\Delta Z$ of optical device 114. (In FIG. 3 and FIG. 4 membrane 26 is omitted for clarity.)

Figure 5:
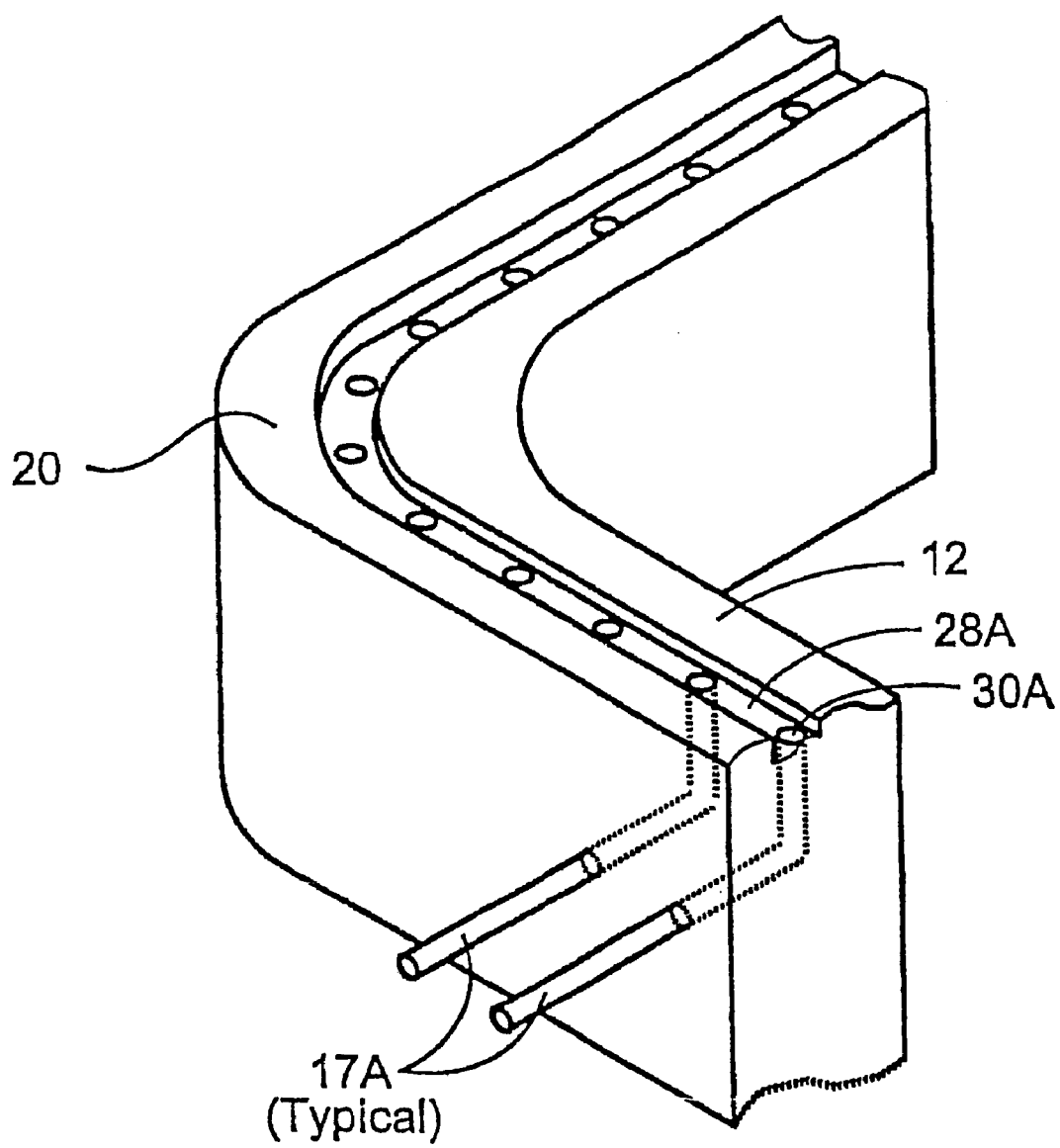
FIG. 5 is a diagrammatic three-dimensional detail representation of the fluid supply system of FIG. 2.

The fluid system 16 may be implemented in a wide variety of manners. By way of example, FIG. 5 depicts significant components of a fluid system 16. In the embodiment shown the fluid system 16 includes a plurality of fluid supply orifices 30A that open into a fluid supply channel 28A cut into the sealing surface 24 of enclosure 12. The fluid supply orifices 30A in turn are feed by fluid feed passages 17A. Thus, helium is delivered to seal interface region 18 of the described structure through the fluid supply orifices 30A. Helium delivered to the plurality of fluid supply orifices 30A is distributed to seal interface region 18 by means of the fluid supply channel 28A cut into sealing surface 24 of enclosure 12.

It is advantageous to uniformly distribute flowing helium to seal interface region 18 to provide equal buoyant bearing along the working surface 20 of seal support member 22 and to prevent fluid gaps or voids along seal interface region 18 that would diminish the effectiveness of fluid seal apparatus 10. (It is to be understood that in FIG. 5 various other components comprising fluid system 16, such as pressure pumps or pressurized gas cylinders necessary to supply helium, are omitted.)

Figure 6:
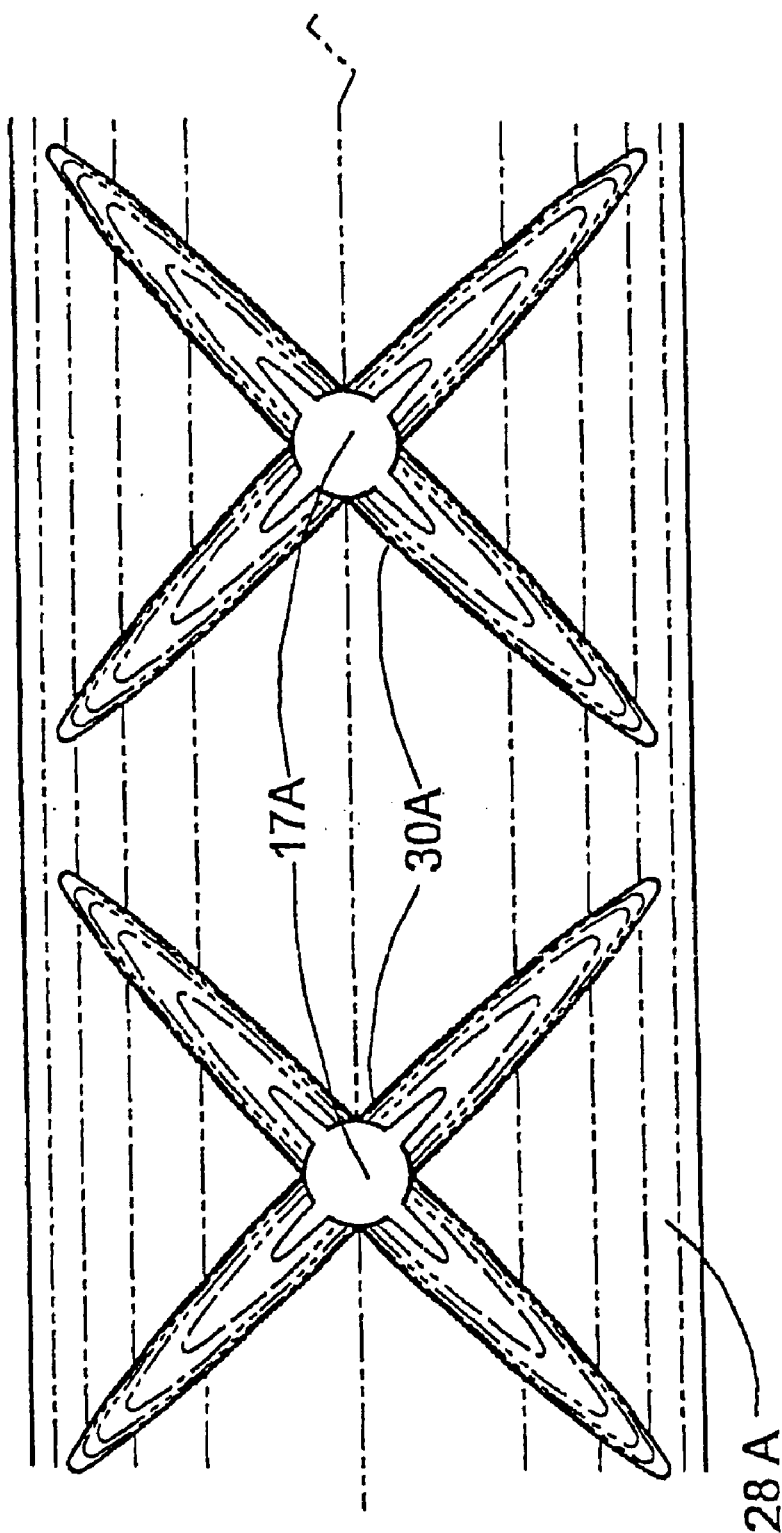
FIG. 6 is a diagrammatic plan-view detail representation of an embodiment of a fluid supply orifice configuration within the fluid supply channel of FIG. 2.

It should be appreciated that the geometry of the fluid supply orifices 30A can be widely varied to achieve the intended function. By way of example, FIG. 6 represents a plan-view detail of a "star-like" fluid supply orifice configuration that works well to provide uniform distribution of fluid to seal interface region 18. Of course a wide variety of other orifice geometries can be used in place of the illustrated star like fluid supply orifice.

The described structure of the first embodiment in addition to effectively providing a gas seal between interior 13 and exterior 14 of enclosure 12 also provides low stiffness flexibility in three additional degrees-of-freedom (Z, $\Theta_X$, $\Theta_Y$) between enclosure 12 and optical device 114. In this first embodiment, both optical device 114 and enclosure 12 are, within limits, able to independently reposition by rotation about both the X-axis ($\Theta_X$), in a pitching motion, about the Y-axis ($\Theta_Y$), in a rolling motion, and by translation along the Z-axis. In each instance, membrane 26 is sufficiently flexible and resilient to offer only low stiffness resistance to the repositioning of enclosure 12 and optical device 114. Membrane 26 stretches, compresses, twists, bends, or otherwise repositions itself in response to relative repositioning of enclosure 12 and optical device 114. Through proper design and selection of low-stiffness membrane materials, only relatively minor elastic forces arise in opposition to a relative displacement between enclosure 12 and optical device 114.

Figure 7:
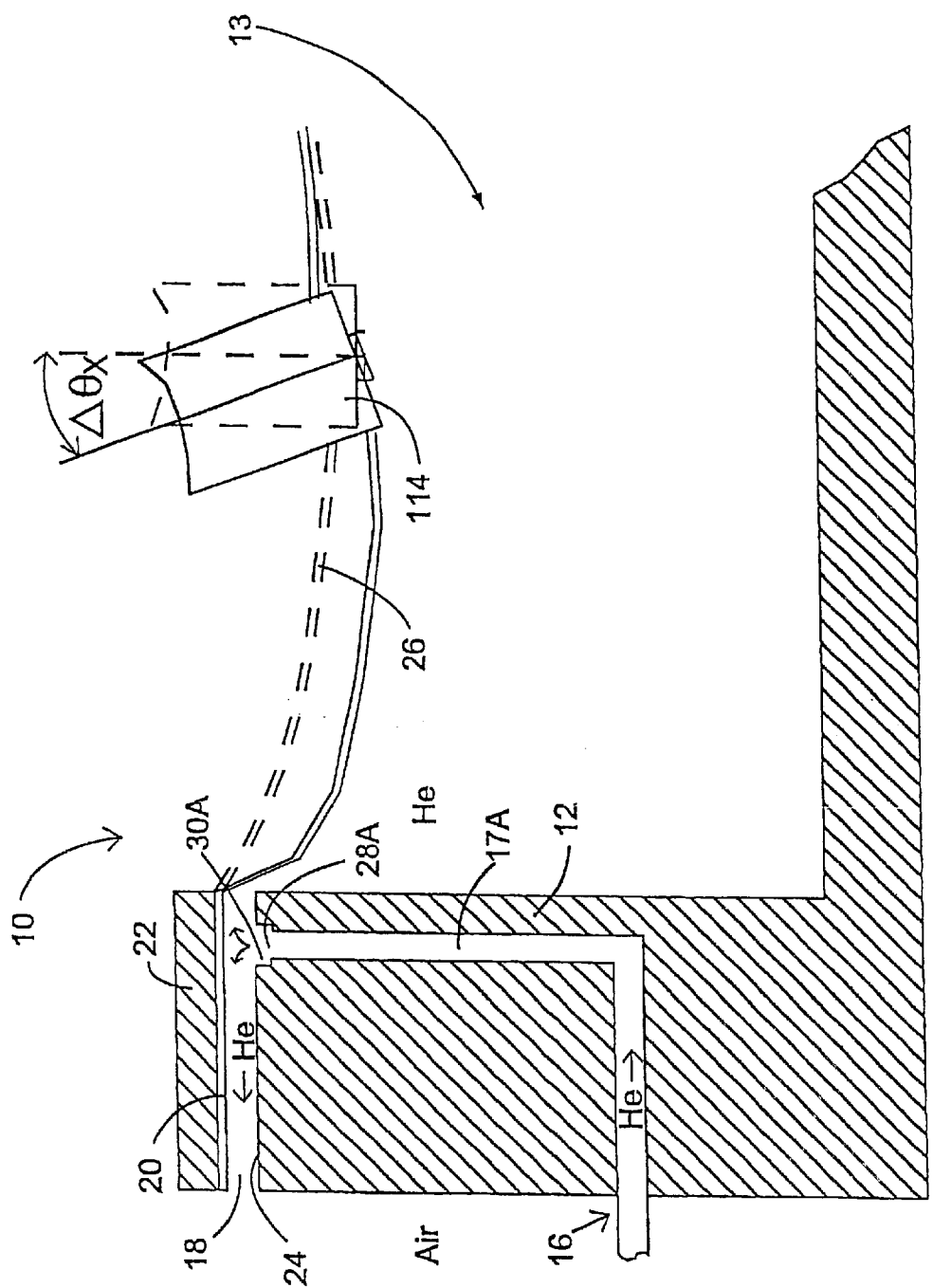
FIG. 7 is a diagrammatic cross-sectional representation of the overall configuration of FIG. 2 showing rotational displacement in accordance with the first embodiment of the present invention.

FIG. 7 is a diagrammatic cross-sectional representation of the overall configuration of FIG. 2 in accordance with the first embodiment of the present invention showing rotational displacement of optical device 114 in relation to enclosure 12. Rotation of optical device 114 about the Z-axis produces a change in angular bearing $\Delta\Theta_X$ of optical device 114. It should be appreciated that the motions illustrated in FIG. 7 is highly exaggerated compared to the actual angular displacement that is likely to occur in photolithography systems.

Figure 8:
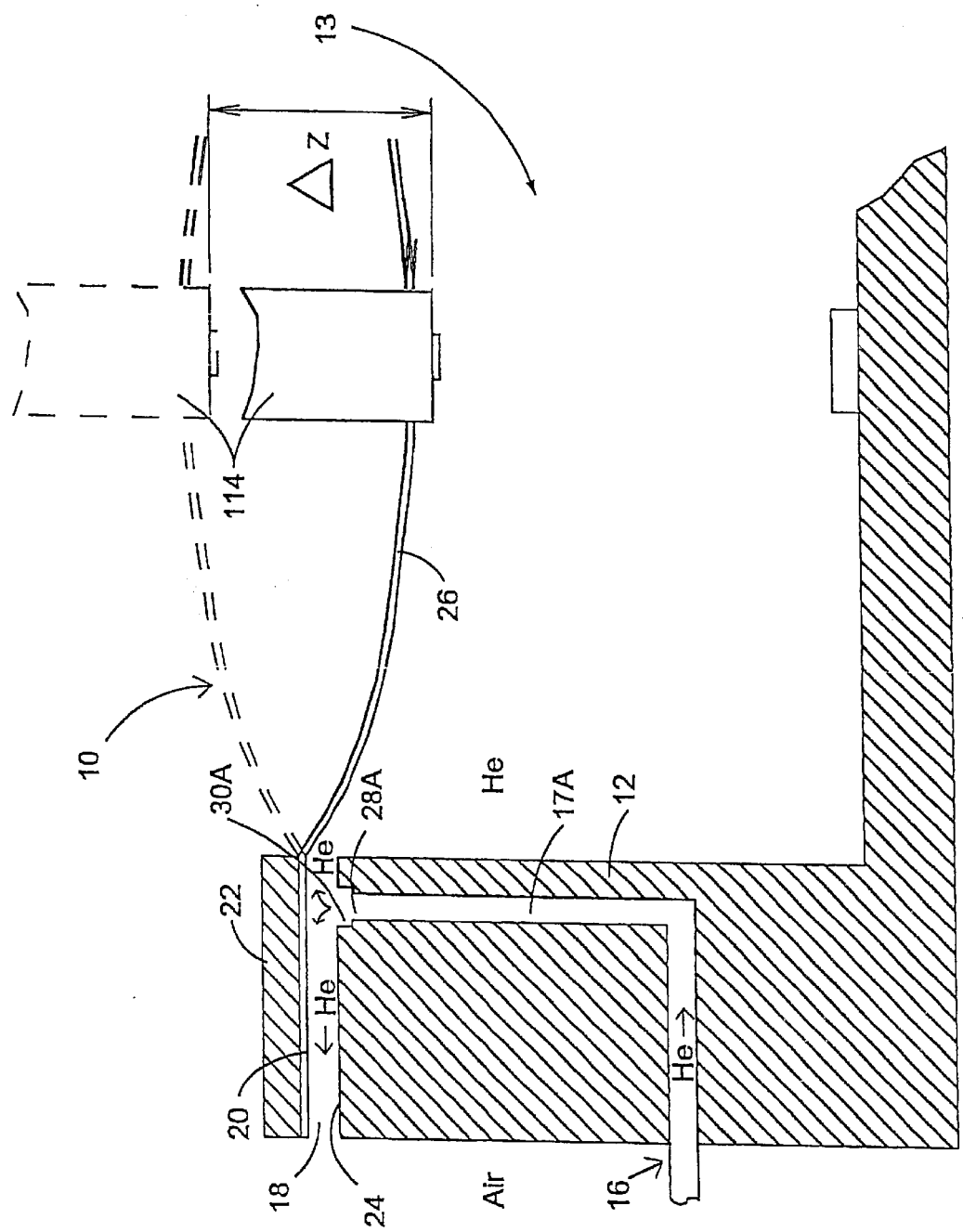
FIG. 8 is a diagrammatic cross-sectional representation of the overall configuration of FIG. 2 showing linear displacement in accordance with the first embodiment of the present invention.

FIG. 8 is a diagrammatic cross-sectional representation of the overall configuration of FIG. 2 in accordance with the first embodiment of the present invention showing linear displacement of optical device 114 in relation to enclosure 12. Translation of optical device 114 along the Z-axis produces a change in the linear position $\Delta Z$ of optical device 114.

The characteristically low friction of the described structure assures that only a small fraction of the vibratory force causing motion in one body in a sealing relationship is transmitted through friction to the second body in the relationship. Likewise, relative displacements between a first and second body, including displacement induced by vibrations, are opposed only by the low resistance force offered by the membrane.

Figure 9:
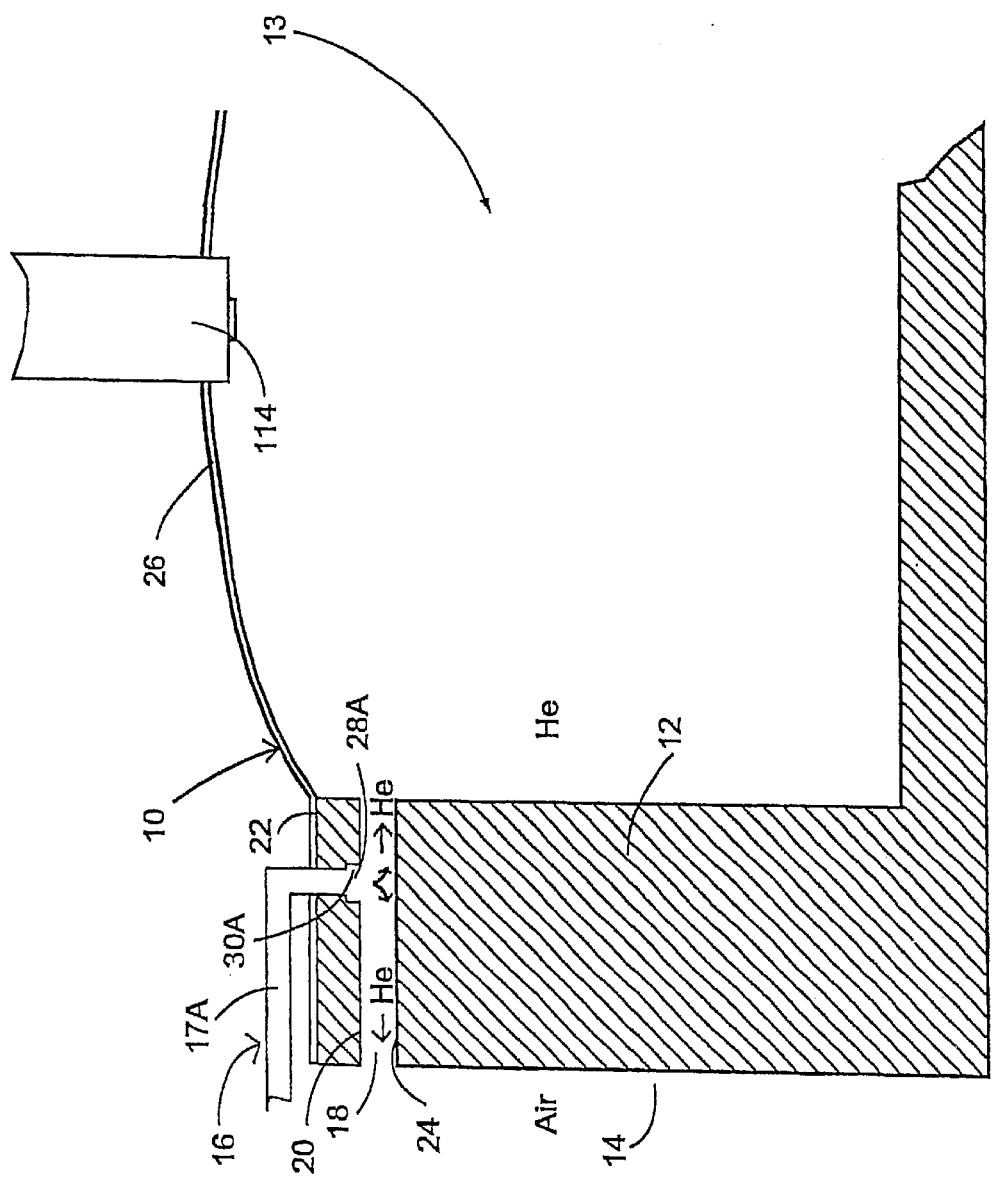
FIG. 9 is a diagrammatic cross-sectional detail representation of the fluid supply channels incorporated within the seal support member in accordance with a second embodiment of the present invention.

Turning again to fluid system 16 in the first embodiment of FIG. 2, it will be noted that fluid supply channel 28A, fluid supply orifices 30A, and fluid feed passages 17A of fluid system 16 are incorporated within enclosure 12. There are practical machining and routing problems associated with incorporating components of fluid system 16 into enclosure 12. FIG. 9 depicts a second embodiment of the present invention wherein fluid supply channel 28A fluid supply orifices 30A, and fluid feed passages 17A of to fluid system 16 is alternatively incorporated within seal support member 22. Routing and machining problems are reduced in this embodiment since seal support member 22 is generally more accessible and of lesser bulk than enclosure 12.

Figure 10:
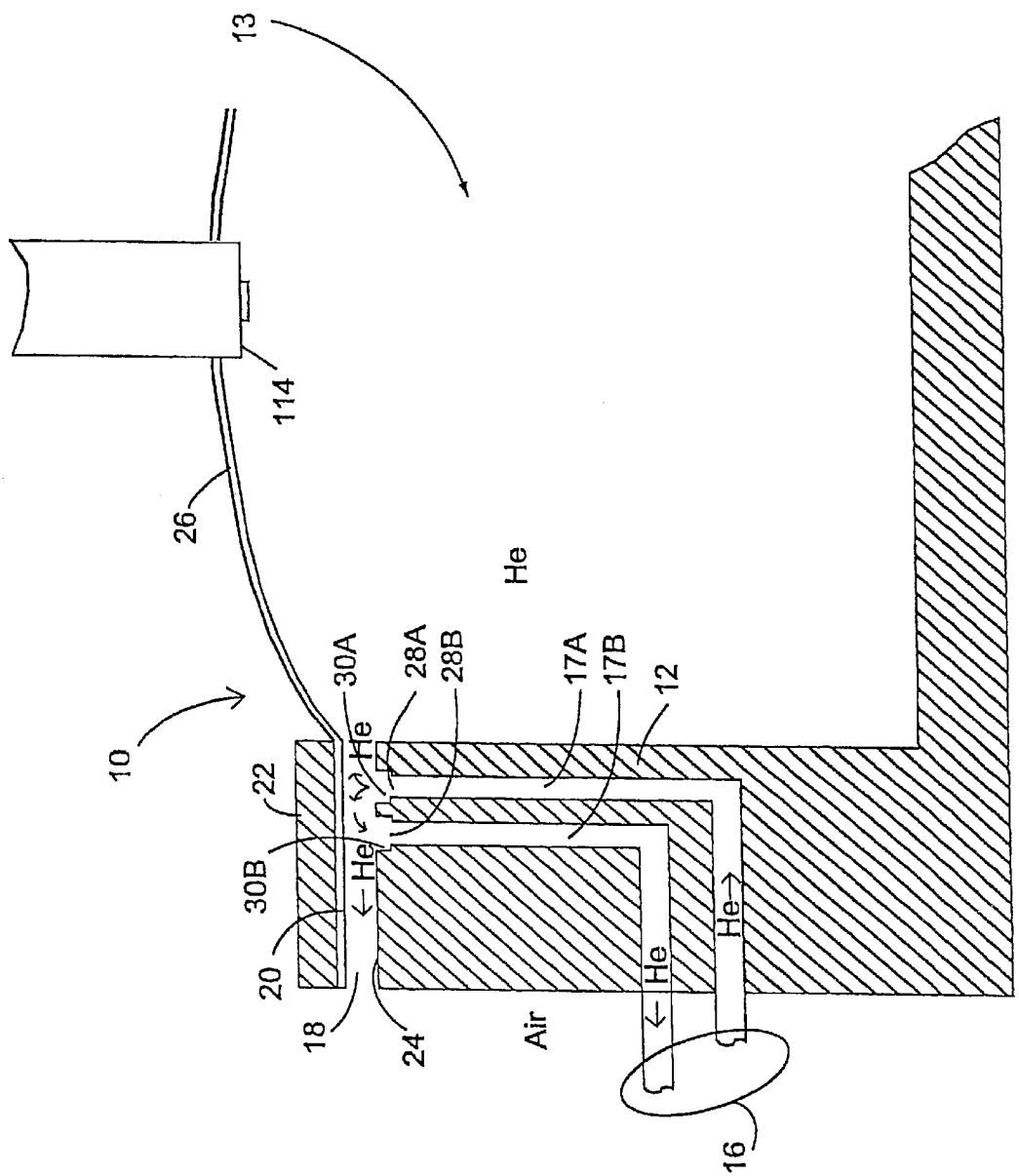
FIG. 10 is a diagrammatic cross-sectional detail representation of the fluid supply and exhaust channels in accordance with a third embodiment of the present invention.

FIG. 10 depicts a third embodiment of the present invention that enhances the basic fluid system of the first embodiment by providing a fluid supply channel 28A to supply fluid to seal interface region 18 and a fluid exhaust channel 28B cut into sealing surface 24 of enclosure 12 to vacuum exhaust the fluid supplied by the fluid supply channel 28A. Fluid exhausted through fluid exhaust channel 28B is in fluid communication with and is turn exhausted through a plurality of fluid exhaust orifices 30B and corresponding fluid exhaust passages 17B incorporated within enclosure 12. The described embodiment provides vacuum "pre-loading" that stiffens seal support member 22 in the X-Y plane and reduces the depth of the gap comprising seal interface region 18 between working surface 20 of seal support member 22 and sealing surface 24 of enclosure 12. Lowering the gap also reduces the fluid leakage rate because flow resistance in increased. Like the first described embodiment, the fluidics may be incorporated into the seal (i.e., the seal support member 22) instead of the walls of enclosure 12.

Figure 11:
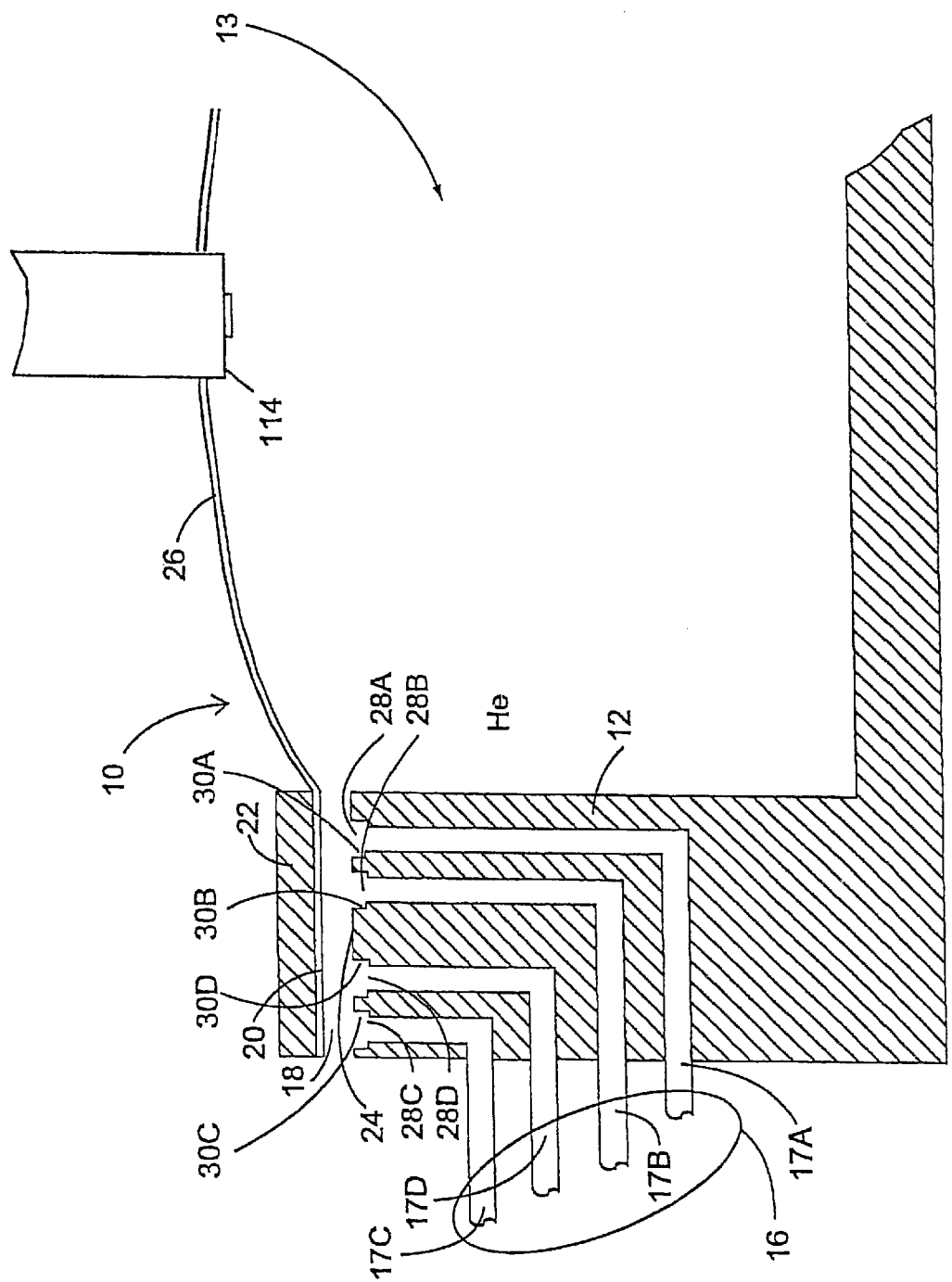
FIG. 11 is a diagrammatic cross-sectional detail representation of the fluid supply and exhaust channels in accordance with a fourth embodiment of the present invention.

FIG. 11 depicts a fourth embodiment of the present invention that further enhances fluid system 16 of the third embodiment. In this embodiment, the fluid system 16 further includes outer fluid supply and exhaust channels 28C and 28D respectively. The outer supply and exhaust channels may be cut into the sealing surface 24 of enclosure 12 just as the inner supply and exhaust channels 28A and 28B were cut into the enclosure as described above. The outer supply channel 28C is fed by a plurality of outer fluid feed passages 17C which open into the outer supply channel 28C through associated outer fluid supply orifices 30C. Similarly, outer fluid exhaust channel 28D is exhausted by outer fluid exhaust passages 17D which open into the fluid exhaust channel 28D through respective outer fluid exhaust orifices 30D. The enhancement of this embodiment also allows for the use of two separate fluids for buoyant flotation of seal support member 22 and enhanced sealing function of the present invention. Fluid exhaust channels 28B and 28D may be operated at equal vacuum to minimize cross flow of fluids supplied by fluid supply channels 28A and 28C respectively. It should be appreciated that this embodiment is particularly useful when trying to maintain a controlled atmosphere within the enclosure 12. More specifically, as pointed out above, photolithography systems typically require the presence of a controlled atmosphere (such as helium) within the wafer enclosure while the surrounding equipment is in a clean room standard air based environment. Thus, the outer fluid supply and exhaust systems may deliver and exhaust air while the inner fluid supply and exhaust systems deliver and exhaust helium. This arrangement tends to reduce the amount of helium lost, while maintaining a pure atmosphere within the enclosure 12. It should be appreciated that this is desirable since helium tends to be significantly more expensive than purified air. Of course, the actual fluid used may be widely varied in accordance with the needs of a particular system. Like the previously described embodiments, the fluidics may alternatively and indeed preferably be incorporated into the seal support member 12 in place of the enclosure walls. This embodiment is generally considered to be the most preferred embodiment in an actual photolithography system.

Figure 12A:
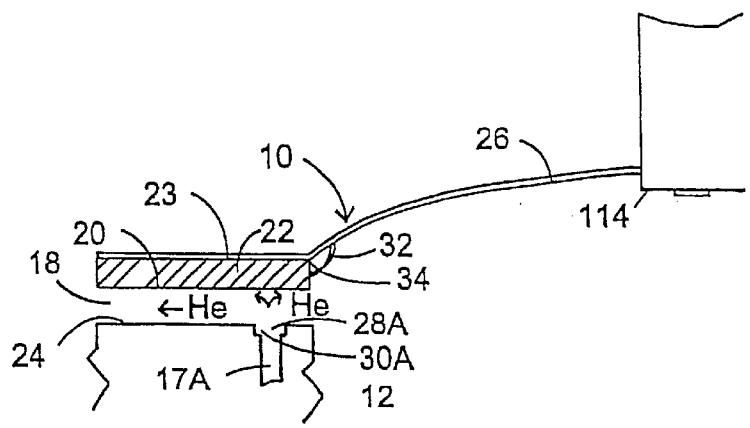
FIG. 12a is a diagrammatic cross-sectional representation of a method of attachment of a flexible membrane to a seal support member in accordance with an embodiment of the present invention.

The membrane 26 may in theory be attached to the seal support ring in a variety of manners as will be described with reference to FIG. 12A, FIG. 12B, and FIG. 12C. In FIG. 12A, membrane 26 completing the seal between optical device 114 and enclosure 12 is located on a top surface 23 of seal support member 22 opposite its working surface 20. This arrangement is beneficial since it allows the fluidics to be readily incorporated into the seal support member 22 without having to pass through the membrane 26. However, it should be appreciated that an adhesive 32 would typically be required to attach membrane 26 to top surface 23 of seal support member 22. One feature of adhesives is that most adhesives will experience some outgassing (e.g., outgassing of certain monomer components of the adhesive). In photolithography systems, it is generally considered important to prevent (or reduce to the extent possible) this type of outgassing into the wafer enclosure. One drawback of putting the adhesive on the top surface of the seal is that the adhesives may outgas into the interior 13 of enclosure 12 at the interface as marked by point 34 in the drawing, which is undesirable.

Figure 12B:
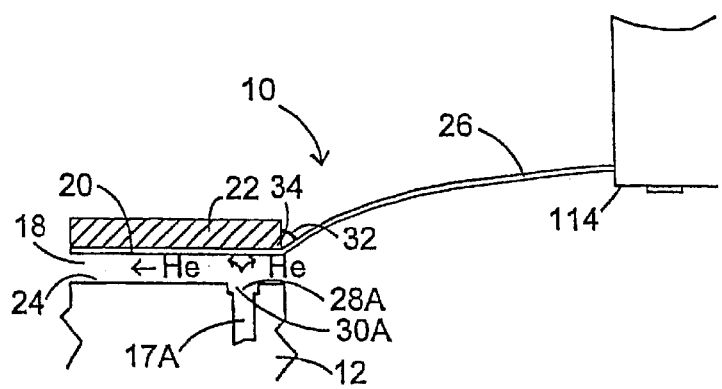
FIG. 12b is a diagrammatic cross-sectional representation of an alternate method of attachment of a flexible membrane to a seal support member in accordance with an embodiment of the present invention.

FIG. 12B illustrates an alternative manner of attaching membrane 26 to seal support member 22 that significantly reduces or eliminates the problems associated with adhesive outgassing. In this embodiment, the membrane 26 is adhesively attached directly to the working surface 20 of seal support member 22. In this embodiment, any outgassing at point 34 is done outside of the enclosure, which prevents contamination of the environment in the enclosure interior 13. However, this arrangement has the drawback of making it more difficult to incorporate the fluidics into the seal support member 22 (which is typically considered to be a preferable arrangement). More specifically, the plumbing would need to penetrate the membrane 26, which although certainly possible, is less desirable.

Figure 12C:
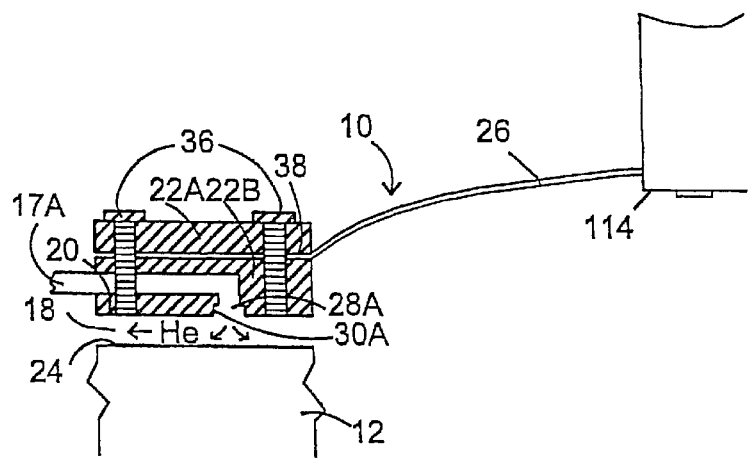
FIG. 12c is a diagrammatic cross-sectional representation of a third method of attachment of a flexible membrane to a seal support member in accordance with an embodiment of the present invention.

FIG. 12C illustrates a more preferred method of creating the seal support member in a manner that both eliminates adhesive outgassing altogether and permits the fluidics to be incorporated into the seal support member. In this embodiment, a pair of seal rings 22A and 22B are used to form the seal support member 22. The seal rings may be clamped together with the membrane 26 positioned therebetween using suitable fasteners such as screws 36. With this arrangement no adhesive is necessary since the membrane 26 is firmly held in place by the clamping action. Any plumbing can then be incorporated into the bottom seal ring. Even if the use of an adhesive is determined to be desirable for a particular application, the membrane 26 may be attached to a bottom surface 38 of top sealing ring 22A. With this arrangement, the adhesive would be located external to the enclosure 12 and any adhesive outgassing would be away from the enclosure interior 13.

Figure 1:
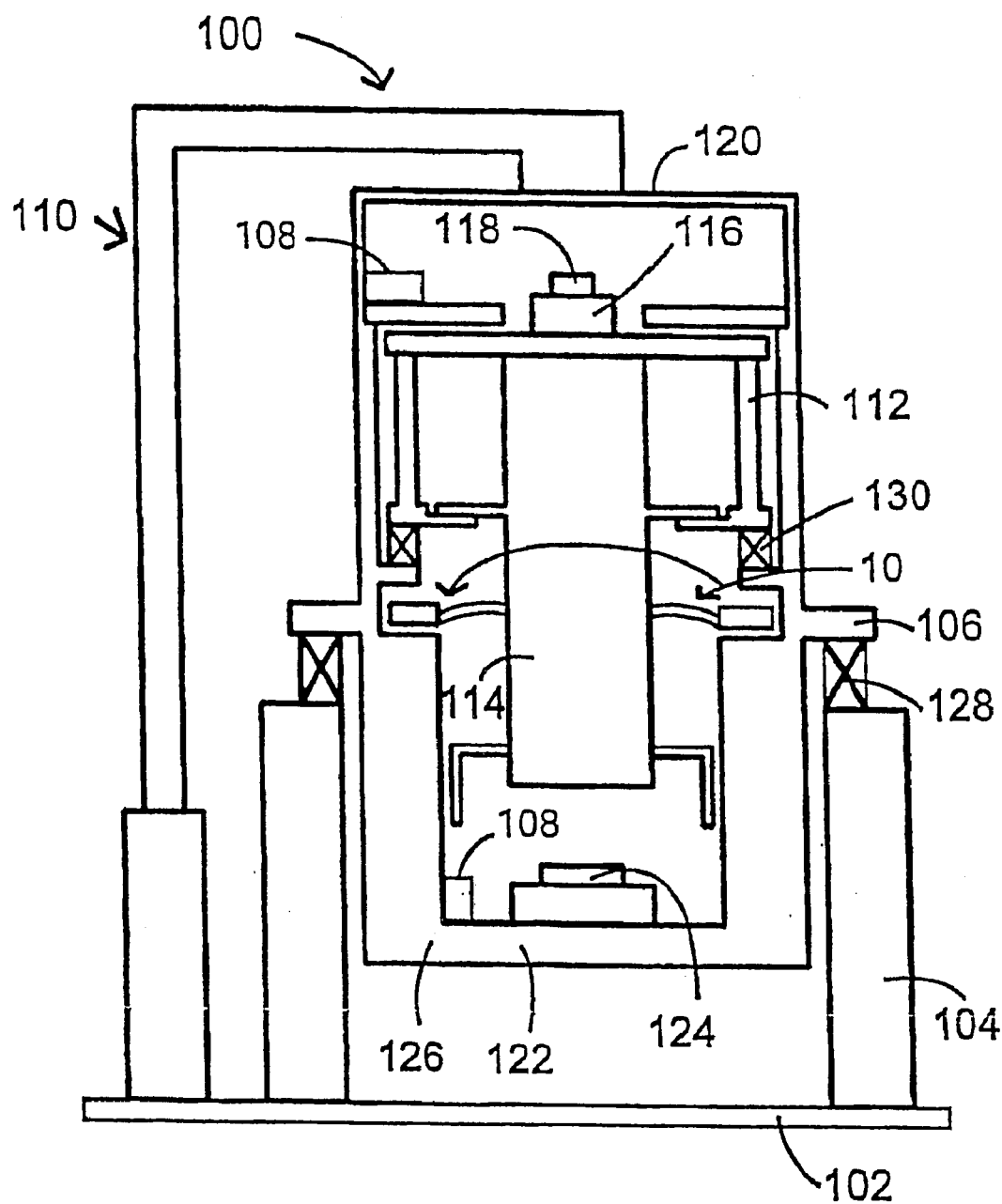
FIG. 1 is a simplified block-type diagram of a photolithographic exposure apparatus that includes the fluid sealing apparatus of the present invention.

Referring next to FIG. 1, one exemplary lithographic exposure that incorporates the present invention will be briefly described. A typical exposure apparatus 100 includes a mounting base 102, a support frame 104, a base frame 106, a measurement system 108, a control system (not shown), an illumination system 110, an optical frame 112, an optical device 114, a reticle stage 116 for retaining a reticle 118, an upper enclosure 120 surrounding reticle stage 116, a wafer stage 122 for retaining a semiconductor wafer workpiece 124, and a lower enclosure 126 surrounding wafer stage 122.

Support frame 104 typically supports base frame 106 above mounting base 102 through a base vibration isolation system 128. Base frame 106 in turn supports, through an optical vibration isolation system 130, optical frame 112, measurement system 108, reticle stage 116, upper enclosure 120, optical device 114, wafer stage 122, and lower enclosure 126 above base frame 106. Optical frame 112 in turn supports optical devise 114 and reticle stage 116 above base frame 106 through optical vibration isolation system 130. As a result thereof, optical frame 112 and its supported components and base frame 106 are effectively attached in series through base vibration isolation system 128 and optical vibration isolation system 130 to mounting base 102. Vibration isolation systems 128 and 130 are designed to damp and isolate vibrations between components of exposure apparatus 100. Measurement system 108 monitors the positions of stages 116 and 122 relative to a reference such as optical device 114 and outputs position data to the control system. Optical device 114 typically includes a lens assembly that projects and/or focuses the light or beam from an illumination system 110 that passes through reticle 118. Reticle stage 116 is attached to one or more movers (not shown) directed by the control system to precisely position reticle 118 relative to optical device 114. Similarly, wafer stage 122 includes one or more movers (not shown) to precisely position the wafer workpiece 124 relative to optical device (lens assembly) 114. Any of the previously describe seals 10 is placed between base frame 106 (the upper enclosure 120) and the lens assembly 114. The described sealing arrangement provides a good seal for the enclosure 120, yet helps prevent the transmission of vibrations between the enclosure and the lens assembly 114.

As will be appreciated by those skilled in the art, there are a number of different types of photolithographic devices. For example, exposure apparatus 100 can be used as a scanning type photolithography system which exposes the pattern from reticle 118 onto wafer 124 with reticle 118 and wafer 124 moving synchronously. In a scanning type lithographic device, reticle 118 is moved perpendicular to an optical axis of lens assembly 114 by reticle stage 116 and wafer 124 is moved perpendicular to an optical axis of lens assembly 114 by wafer stage 122. Scanning of reticle 1 8 and wafer 124 occurs while reticle 118 and wafer 124 are moving synchronously.

Alternately, exposure apparatus 100 can be a step-and-repeat type photolithography system that exposes reticle 118 while reticle 118 and wafer 124 are stationary. In the step and repeat process, wafer 124 is in a constant position relative to reticle 118 and lens assembly 114 during the exposure of an individual field. Subsequently, between consecutive exposure steps, wafer 124 is consecutively moved by wafer stage 122 perpendicular to the optical axis of lens assembly 114 so that the next field of semiconductor wafer 124 is brought into position relative to lens assembly 114 and reticle 118 for exposure, Following this process, the images on reticle 118 are sequentially exposed onto the fields of wafer 124 so that the next field of semiconductor wafer 124 is brought into position relative to lens assembly 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to lens assembly 114, when far ultra-violet rays such as the excimer laser is used, glass materials such as quartz and fluorite that transmit far ultra-violet rays is preferably used. When the $F_2$ type laser or x-ray is used, lens assembly 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. No. 5,623,853 or U.S. Pat. No. 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 13:
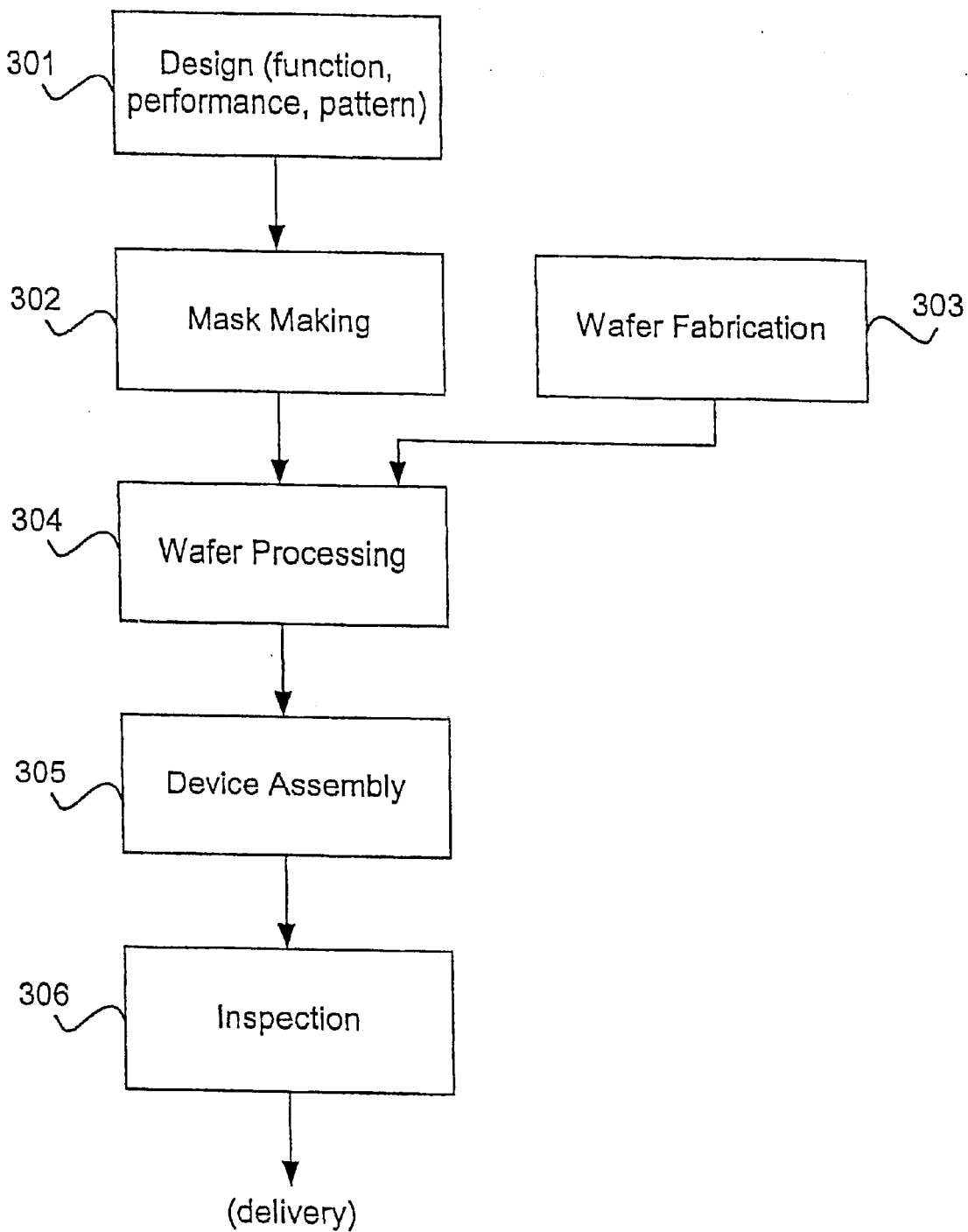
FIG. 13 is a flowchart illustrating a representative method of fabricating a semiconductor device using a lithography device incorporating the present invention.

Further, semiconductor devices can be fabricated using the above described systems, by the process shown generally in FIG. 13. In step 301 the device's function and performance characteristics are designed. Next, in step 302, a mask (reticle) having a pattern it designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 14:
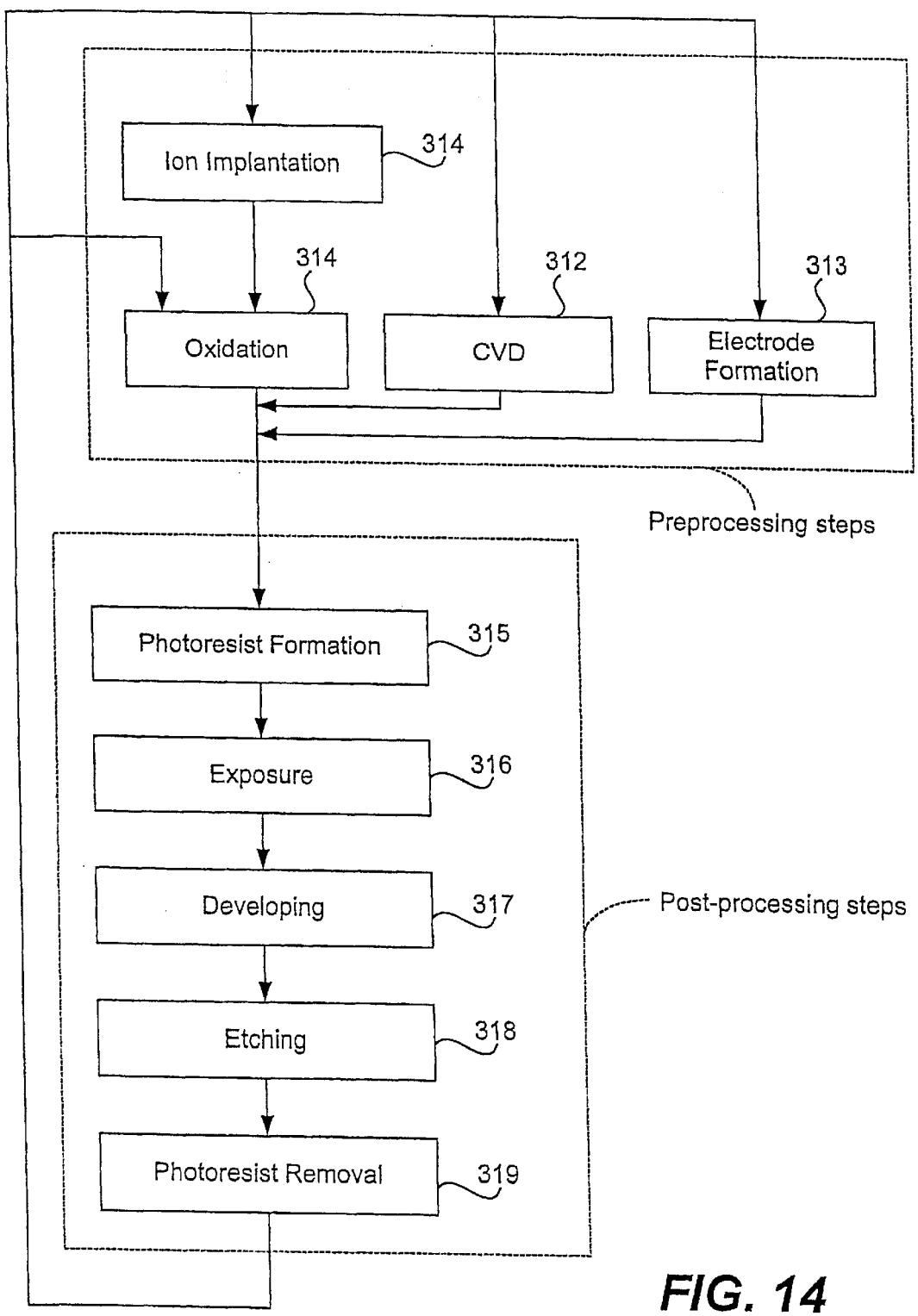
FIG. 14 is a flowchart illustrating a representative method of implementing the wafer processing step of FIG. 13.

FIG. 14 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

Although only a few embodiments of the present invention have been described, it should be understood that the present invention may be embodied in many other specific forms without departing from the spirit or the scope of the present invention. By way of example, although the seal has been described in the context of a preferred embodiment wherein it seals the space between a wafer enclosure and an optical device in a photolithography system, it is believed that the seal will also have a number of other potential applications both within and outside of photolithography. Further, the fluidics has been described primarily in the context of a system where a closed helium environment is required on one side of the seal and clean room standard air is appropriate on the other side of the seal. Thus, the fluids delivered into the seal region were helium and air respectively. However, it should be appreciated that other fluids can readily be used as appropriate for a particular system.

A few different plumbing arrangements have been specifically discussed. However, it should be apparent that the plumbing can be widely varied to meet the needs of a particular application. For example, in place of placing the plumbing in the traditional enclosure chamber walls, one or more separate pieces can readily be attached to the top of the enclosure wall (and thereby become a part of the enclosure wall) to provide both the required plumbing and the sealing surface 24 for the enclosure. Additionally, the fluid supply and exhaust systems have been described primarily in the context of systems that are incorporated into one of the enclosure or the seal support member. However, it should be appreciated that different portions of the fluidics can readily be divided between the two components (and/or integrated into additional components). For example, the fluid feed and exhaust passages 17 may be provided in the seal support member while the distribution channels (fluid supply channel) 28 may be provided in the sealing surface of the enclosure or vice versa. Alternatively, the fluid supply system(s) may be incorporated into one component while the fluid exhaust system(s) may be incorporated into the other. Of course, the actual geometries of the various fluidic passages, channels and/or orifices may also be widely varied.

It will also be apparent to those skilled in the art that the described arrangements can be used in a wide variety photolithography systems beyond those specifically described. Therefore, the present examples are to be considered as illustrative and not restrictive, and the invention is not to be limited to the details given herein, but may be modified within the scope of the appended claims.

What is claimed is:

1. A sliding seal system that provides a seal between first and second bodies, the sliding seal system comprising:
    a support member having a working surface arranged to provide a seal interface with a sealing surface on the first body;

a membrane attached to the support member, and coupled to the second body; and a fluid supply system that delivers a fluid to a region between the working surface of the support member and the sealing surface of the first body to provide buoyant floatation to the support member at the working surface.

2. A sliding seal system as recited in claim 1 further comprising a fluid exhaust system for removing fluid delivered by the fluid supply system.

3. A sliding seal system as recited in claim 2 wherein the fluid supply system includes a fluid delivery passage and the fluid exhaust system includes a fluid exhaust passage, wherein the fluid exhaust passage is designed to remove fluid delivered through the fluid delivery passage, the fluid supply and exhaust passages being incorporated into at least one of the first body and the support member.

4. A sliding seal system as recited in claim 1 wherein the fluid supply system is at least partially incorporated into the first body.

5. A sliding seal system as recited in claim 1 wherein the fluid supply system is at least partially incorporated into the support member.

6. A sliding seal system as recited in claim 2 wherein:
the fluid supply system includes interior and exterior fluid delivery passages arranged to deliver different fluids to the region between the working surface of the support member and the sealing surface of the first body; and
the fluid exhaust system includes interior and exterior fluid exhaust passages, wherein the interior fluid exhaust passage is designed to remove fluid delivered through the interior fluid delivery passage and the exterior fluid exhaust passage is designed to remove fluid delivered through the exterior fluid delivery passage.

7. A sliding seal system as recited in claim 1 further comprising a fluid distribution channel formed in one of the working surface of the support member and the sealing surface of the first body, the fluid distribution channel distributing the fluid along the region between the working surface of the support member and the sealing surface of the first body.

8. A sliding seal system as recited in claim 2 wherein the fluid supply system includes a first fluid distribution channel and the fluid exhaust system includes a second fluid distribution channel, the first and second distribution channels being formed in one of the working surface of the support member and the sealing surface of the first body.

9. A sliding seal system as recited in claim 1 wherein:
the support member includes a first fixing member and a second fixing member that includes the working surface; and
the membrane is interposed between the first and second fixing members.

10. A sliding seal system as recited in claim 9 wherein the fluid supply system is at least partially incorporated into the second fixing member.

11. A sliding seal system for use in a photolithography system to provide a seal between an exposure apparatus and a chamber, the sliding seal system comprising:
a support member having a working surface arranged to provide a seal interface with a sealing surface on the chamber;
a membrane attached to the support member, and coupled to the exposure apparatus;
interior and exterior fluid delivery systems for delivering first and second fluids to a region between the working surface and sealing surface to provide buoyant floatation for the support member; and
interior and exterior fluid exhaust systems, wherein the interior fluid exhaust system is designed to remove the first fluid delivered through the interior fluid delivery system and the exterior fluid exhaust system is designed to remove the second fluid delivered through the exterior fluid delivery system.

12. A sliding seal system as recited in claim 11 wherein the interior and exterior fluid delivery systems and the interior and exterior fluid exhaust system each include fluid delivery passages incorporated into walls of the chamber.

13. A sliding seal system as recited in claim 11 wherein the interior and exterior fluid delivery systems and the interior and exterior fluid exhaust systems each include fluid delivery passages incorporated into the support member.

14. A sliding seal system as recited in claim 13 wherein:
the support member includes a first fixing member and a second fixing member, wherein the second fixing member is positioned adjacent the sealing surface of the chamber;
the membrane is interposed between the first and second fixing members; and
the fluid delivery passages are incorporated into the second fixing member.

15. A sliding seal system as recited in claim 14 wherein no adhesive is used to attach the membrane to the support member.

16. A sliding seal system as recited in claim 12 wherein the membrane is attached to a bottom surface of the support member with an adhesive such that the adhesive is applied exterior to chamber so that any out-gassing from the adhesive occurs outside the chamber.

17. A sliding seal system as recited in claim 11 wherein the interior and exterior fluid delivery systems and the interior and exterior fluid exhaust systems each include fluid distribution channels incorporated into the sealing surface of the chamber.

18. A sliding seal system as recited in claim 11 wherein the interior and exterior fluid delivery systems and the interior and exterior fluid exhaust systems each include fluid distribution channels incorporated into the working surface of the support member.

19. A sliding seal system as recited in claim 2 wherein:
the fluid supply system includes first and second delivery passages arranged to deliver the fluid to the region; and
the fluid exhaust system includes a first and second exhaust passages, wherein the first exhaust passage is designed to remove fluid delivered through the first fluid delivery passage and the second exhaust passage is designed to remove fluid delivered through the second fluid delivery passage.

20. A lithography system comprising:
an illumination system;
an optical system;
a stage that is moveable relative to the optical system;
an enclosure that surrounds at least a portion of the stage, the enclosure having a sealing surface;
a support member having a working surface arranged to provide a seal interface with the sealing surface on the enclosure;
a membrane attached to the support member, and coupled to the optical system; and
a fluid supply system that delivers a fluid to a region between the working surface of the support member and the sealing surface of the enclosure to provide buoyant floatation to the support member at the working surface, whereby a sliding seal system is formed that provides a seal between the working surface of the enclosure and the optical system.

21. A lithography system as recited in claim 20 further comprising a fluid exhaust system for removing fluid delivered by the fluid supply system.

22. A lithography system as recited in claim 21 wherein:
the fluid supply system includes first and second delivery passages arranged to deliver the fluid to the region; and the fluid exhaust system includes a first and second exhaust passages, wherein the first exhaust passage is designed to remove fluid delivered through the first fluid delivery passage and the second exhaust passage is designed to remove fluid delivered through the second fluid delivery passage.

23. A lithography system as recited in claim 21 wherein the fluid supply system includes a fluid delivery passage and the fluid exhaust system includes a fluid exhaust passage, wherein the fluid exhaust passage is designed to remove fluid delivered through the fluid delivery passage, the fluid supply and exhaust passages being incorporated into at least one of the enclosure and the support member.

24. A method for making an object using a lithography process, wherein the lithography process utilizes a lithography system as recited in claim 20.

25. A method for patterning a wafer using a lithography process, wherein the lithography process utilizes a lithography system as recited in claim 20.

26. An exposure apparatus comprising the sliding seal system of claim 1.

27. A sliding seal system as recited in claim 1 further comprising a fluid distribution channel formed in the working surface of the support member, the fluid distribution channel distribution the fluid along the region between the working surface of the support member and the sealing surface of the first body.

28. A sliding seal system as recited in claim 2 wherein the fluid supply system includes a first fluid distribution channel and the fluid exhaust system includes a second fluid distribution channel, the first and second distribution channels being formed in the working surface of the support member.

* * * * *